US008421440B2

(12) United States Patent
Oksanen et al.

(10) Patent No.: US 8,421,440 B2
(45) Date of Patent: Apr. 16, 2013

(54) APPARATUS FOR SPECTRUM SENSING AND ASSOCIATED METHODS

(75) Inventors: Markku Anttoni Oksanen, Helsinki (FI); Eira Tuulia Seppälä, Helsinki (FI); Vladimir Alexsandrovich Ermolov, Espoo (FI); Pirjo Marjaana Pasanen, Helsinki (FI); Joni Jantunen, Helsinki (FI)

(73) Assignee: Nokia Corporation, Espoo (FI)

( * ) Notice: Subject to any disclaimer, the term of this patent is extended or adjusted under 35 U.S.C. 154(b) by 423 days.

(21) Appl. No.: 12/911,474

(22) Filed: Oct. 25, 2010

(65) Prior Publication Data

US 2012/0100810 A1   Apr. 26, 2012

(51) Int. Cl.
    *G01R 23/00* (2006.01)
(52) U.S. Cl.
    USPC .......... 324/76.19; 324/76.11; 324/76.12; 702/66; 702/76; 702/77
(58) Field of Classification Search ............ 324/252, 324/260, 375, 76.11, 76.12, 76.19; 701/13; 702/66, 76, 77; 428/811.2; 375/260
    See application file for complete search history.

(56) References Cited

U.S. PATENT DOCUMENTS

| 2008/0241597 | A1 | 10/2008 | Dieny et al. |
| 2009/0140733 | A1 | 6/2009 | Koga et al. |
| 2010/0289490 | A1 | 11/2010 | Fan et al. |

FOREIGN PATENT DOCUMENTS

WO   WO 201097997 A1   9/2010

OTHER PUBLICATIONS

Ermolov, V., et al., "Significance of Nanotechnology for Future Wireless Devices and Communications," 18th Annual IEEE International Symposium on Personal, Indoor and Mobile Radio Communications (PIMRC '07), Conf. Proc. Article, Sep. 2007, 5 pages.
Wang, H., et al., "Graphene Frequency Multipliers," IEEE Electron Device Letters, vol. 30, No. 5, May 2009, pp. 547-549.
"The Tunable Nano-Magnetic Oscillator," The TUNAMOS project, Jul. 1, 2005-Aug. 30, 2008, http://www.imec.be/tunamos/public/results.html, © 2005 Tunamos, 7 pages.
Fan, X., et al., "Magnetic tunnel junction based microwave detector," American Institute of Physics, Applied Physics Letters 95, 122501, 2009, 3 pages.
Wang, C., et al., "Sensitivity of spin-torque diodes for frequency-tunable resonant microwave detection," American Institute of Physics, Journal of Applied Physics 106, 053905, 2009, 6 pages.
Tulapurkar, A.A., et al., "Spin-torque diode effect in magnetic tunnel junctions," Nature, vol. 438, Nature Publishing Group, Nov. 17, 2005, pp. 339-342.
Sahai, A., et al., "Spectrum Sensing Fundamental Limits and Practical Challenges," Presentation, Dyspan, 2005, 138 pages.

*Primary Examiner* — Patrick Assouad
*Assistant Examiner* — Sean Curtis
(74) *Attorney, Agent, or Firm* — Harrington & Smith

(57) ABSTRACT

In one embodiment, an apparatus comprises a nano-scale spectrum sensor configured to be electromagnetically excitable at a predetermined frequency based on received ambient electromagnetic radiation. The apparatus is also configured to be able to use this excitation of the nano-scale spectrum sensor to thereby determine ambient electromagnetic radiation spectrum usage.

16 Claims, 4 Drawing Sheets

APPARATUS FOR SPECTRUM SENSING AND ASSOCIATED METHODS

TECHNICAL FIELD

The present disclosure relates to the field of cognitive radio technology (for example, for use in white-space devices, wide-band transceivers, frequency usage monitoring, and the like), associated methods, computer programs and apparatus. Certain disclosed aspects/embodiments relate to portable electronic devices, in particular, so-called hand-portable electronic devices which may be hand-held in use (although they may be placed in a cradle in use). Such hand-portable electronic devices include so-called personal digital assistants (PDAs).

The portable electronic devices/apparatus according to one or more disclosed aspects/embodiments may provide one or more audio/text/video communication functions (for example, telecommunication, video-communication, and/or text transmission (short message service (SMS)/multimedia message service (MMS)/emailing) functions), interactive/non-interactive viewing functions (for example, web-browsing, navigation, TV/program viewing functions), music recording/playing functions (for example, MP3 or other format and/or (FM/AM) radio broadcast recording/playing), downloading/sending of data functions, image capture function (for example, using a built-in digital camera), and gaming functions.

BACKGROUND

Spectrum sensing in cognitive radio technology uses mechanisms/arrangements such as scanning type spectrometers or digital conversion based fast Fourier transform (FFT)-type real time spectral sensors. These methods have, for example, a high power consumption, and also have a relatively high associated cost and complexity.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY OF THE INVENTION

In a first aspect, there is provided an apparatus comprising a nano-scale spectrum sensor configured to be electromagnetically excitable at a predetermined frequency based on received ambient electromagnetic radiation, the apparatus being configured to be able to use the excitation of the nano-scale spectrum sensor to determine ambient electromagnetic radiation spectrum usage. The nano-scale spectrum sensor may be configured to be able to generate excitation signaling in response to being excited by received electromagnetic radiation at and/or near its particular predetermined frequency, and wherein the apparatus is configured to determine, based on the generated excitation signaling, ambient electromagnetic radiation spectrum usage. The nano-scale spectrum sensor may comprise one or more magnetic tunnel junctions and/or one or more spin torque oscillators. The nano-scale spectrum sensor may comprise one or more magnetic tunnel junctions. The spin torque oscillators may be physically and/or electromagnetically tuned to different respective predetermined frequencies.

The apparatus may comprise a graphene frequency multiplier configured to multiply the frequency of one or more portions of received ambient electromagnetic radiation, prior to detection by the nano-scale spectrum sensor, so as to shift the frequency range of the received radiation portions into the particular predetermined frequency of the nano-scale spectrum sensor. The graphene frequency multiplier may serve as an electronic component that operates on electromagnetic radiation (for example, as represented by electromagnetic signaling) that has been received by the multiplier (and therefore received by the apparatus) and incoming towards the spectrum sensor (but yet to be received by the sensor). The frequency multiplier may be configured to multiply the frequency of received ambient electromagnetic radiation (received by the apparatus, but not the nano-scale sensor at a given time instant) to thereby increase the resolution and widen the detectable frequency range of the received ambient electromagnetic radiation spectrum.

The nano-scale spectrum sensor may be configured to be able to generate excitation signaling in response to being excited by ambient electromagnetic radiation at and/or near its particular predetermined frequencies, and wherein the apparatus is configured to determine, based on the generated excitation signaling, ambient electromagnetic radiation spectrum usage. The apparatus may be configured to use an auto-correlation function on the excitation signaling to determine spectrum usage. The nano-scale spectrum sensors may be configured to be selectively sensitive to ambient electromagnetic radiation substantially at the tuned frequency of a respective sensor.

The nano-scale spectrum sensor may comprise a sensor pair formed from a first sensor, and a second sensor coupled to the first sensor, wherein the first sensor is tuned to a first predetermined excitation frequency, the second sensor is tuned to a second predetermined excitation frequency, and one of the sensors of the pair is configured to act as a reference sensor. The sensor pair are configured to be able to generate excitation signaling in response to being excited by ambient electromagnetic radiation, the excitation signaling being generated based on the frequency of received radiation and the predetermined excitation frequency of the reference sensor of the pair, The apparatus is configured to determine the frequency of received radiation based on the generated excitation signaling to thereby determine ambient electromagnetic radiation spectrum usage.

The nano-scale spectrum sensor may comprise a sensor pair formed from a first sensor, and a second sensor coupled to the first sensor so as to define a heterodyne/homodyne sensor pair, wherein the first sensor is configured to act as a mixer, and the second sensor is configured to act as a local oscillator to provide a reference frequency for the sensor pair. The sensor pair is configured to be able to generate excitation signaling in response to being excited by ambient electromagnetic radiation, the excitation signaling being generated based on the frequency of received radiation and the reference frequency of the second sensor of the pair. The apparatus is configured to determine the frequency of received radiation based on the generated excitation signaling to thereby determine ambient electromagnetic radiation spectrum usage. The sensor pair may be configured to generate excitation signaling that is the product of frequency of received radiation and the tuned frequency of the reference sensor of the pair, the apparatus being configured to determine the ambient electromagnetic frequency usage from the generated excitation signaling based on the tuned frequency of the reference sensor.

The array of sensors may comprise at least one magnetic tunnel junction and at least one spin torque oscillator that are each tuned to a particular frequency so as to act as a sensor pair that is configured to be electromagnetically excitable by ambient electromagnetic radiation at that particular frequency. The first sensor may be/comprise a magnetic tunnel junction and the second sensor may be/comprise a spin torque oscillator. The reference sensor may be the second sensor/spin torque oscillator. The excitation signaling of the sensor pair may be the product of the input signal and the tuned frequency of the spin torque oscillator. The array of sensors may comprise one or more sensor pairs.

The apparatus may comprise a filter configured to filter the generated excitation signaling of the sensor pair to allow for determination of frequencies substantially at the predetermined excitation frequency of the reference sensor of the pair. The filter may comprise a low-pass, high-pass or simple/complex band-pass filter. The apparatus may comprise a low-pass filter that filters the output of the sensor/sensor pair to determine frequencies substantially at the predetermined frequency of the sensor/sensor pair.

The apparatus may comprise a processor configured to detect electromagnetic excitation of a nano-scale spectrum sensor, and determine ambient electromagnetic radiation spectrum usage using the detected excitation of the nano-scale spectrum sensor. The apparatus may also comprise an amplifier connected to the sensor/sensors and configured to amplify excitation signaling generated by the sensor/sensors. The apparatus may also utilize an analog to digital converter (ADC) to be able to sample the analog excitation signaling from the sensors into digital information. The apparatus may also utilize a threshold detector that is responsive to excitation signaling exceeding a certain threshold (for example, voltage level). The apparatus may comprise or be connected to a wide-band/broad-spectrum antenna configured to receive one or more portions of ambient electromagnetic radiation in the electromagnetic spectrum for provision to the at least one nano-scale spectrum sensor.

The nano-scale spectrum sensor may comprise an array of nano-scale sensors configured to be electromagnetically excitable at different predetermined frequencies based on received ambient electromagnetic radiation, the apparatus being configured to use the excitation of the sensor array to determine ambient electromagnetic radiation spectrum usage. The skilled person will appreciate that signaling received from the array will be used to detect electromagnetic excitation of the array. The apparatus may also be/be provided in a white-space device, a portable electronic device, and a module for a white-space/portable electronic device.

In another aspect, there is provided an apparatus comprising at least one processor, and at least one memory including computer program code, the at least one memory and the computer program code are configured to, with the at least one processor, cause the apparatus to detect electromagnetic excitation of a nano-scale spectrum sensor adapted to be electromagnetically excitable at a predetermined frequency based on received ambient electromagnetic radiation, and determine ambient electromagnetic radiation spectrum usage using the detected excitation of the nano-scale spectrum sensor. In another aspect, there is provided a portable electronic device comprising the apparatus immediately above.

In another aspect there is provided a method comprising detecting electromagnetic excitation of a nano-scale spectrum sensor configured to be electromagnetically excitable at a predetermined frequency based on received ambient electromagnetic radiation. The method also comprises determining ambient electromagnetic radiation spectrum usage using the detected excitation of the nano-scale spectrum sensor.

In another aspect, there is provided an apparatus comprising a nano-scale means for sensing configured to be electromagnetically excitable at a predetermined frequency based on received ambient electromagnetic radiation. The apparatus also comprises a determinator configured to use the excitation of the nano-scale spectrum sensor to determine ambient electromagnetic radiation spectrum usage.

The present disclosure includes one or more corresponding aspects, embodiments or features in isolation or in various combinations whether or not specifically stated (including claimed) in that combination or in isolation. Corresponding means for performing one or more of the discussed functions are also within the present disclosure. Corresponding computer programs for implementing one or more of the methods disclosed are also within the present disclosure and encompassed by one or more of the described embodiments. The above summary is intended to be merely exemplary and non-limiting.

BRIEF DESCRIPTION OF THE DRAWINGS

A description is now given, by way of example only, with reference to the accompanying drawings, in which.

DETAILED DESCRIPTION OF ILLUSTRATIVE EMBODIMENTS

In one or more embodiments described herein, there is provided an apparatus. The apparatus comprises a nano-scale spectrum sensor (also referred to as "nano-scale sensor(s) or "sensor(s)") configured to be electromagnetically excitable at a predetermined frequency based on received ambient electromagnetic radiation. The apparatus is configured to be able to use this excitation of the nano-scale spectrum sensor to thereby determine ambient electromagnetic radiation spectrum usage. The operation of determining ambient electromagnetic radiation spectrum usage can be understood to encompass determining spectrum usage in the vicinity of the apparatus. 'Ambient' electromagnetic radiation can be understood to encompass electromagnetic radiation surrounding the apparatus and/or the array.

The sensor effectively provides for selectively sensitive frequency power/usage monitoring. The term 'selectively sensitive' can be understood to encompass a given sensor being configured to be particularly sensitive to received electromagnetic radiation at and/or near a specific frequency to which the sensor is tuned. In essence, the level of excitation of the sensor is indicative of the power spectrum of the radiation being received by the apparatus at the particular predetermined frequency of the sensor. Ambient electromagnetic radiation at and/or near the predetermined frequency of the sensor can therefore be detected via the tuning of the at least one sensor.

In other embodiments discussed below, more than one sensor can be provided in an array of sensors, with the sensors being tuned to different predetermined frequencies to allow for excitation at different frequencies of electromagnetic radiation across a frequency range of the electromagnetic spectrum. Electromagnetic radiation can be understood to encompass one or more transmission portions of the electromagnetic spectrum, such as radio frequencies, microwaves, or the like. The sensors, in one embodiment, are configured to be electromagnetically excitable at different predetermined radio frequencies. The sensor (or array) will therefore be excited by such received radiation, though the array will not be excited to the same extent if radiation at predetermined tuned frequencies is not present. The difference in the sensor response in accordance with the frequencies of incoming radiation will therefore be indicative of ambient electromagnetic radiation, which in turn can allow the apparatus to determine ambient spectrum usage.

Such sensor arrangements can provide for a number of advantages. For example, the abovementioned apparatus does not necessarily require the use of fast Fourier transforms (FFTs) or other computationally intensive operations to determine spectrum usage. Other advantages will also become apparent in the following description.

Figure 1B:
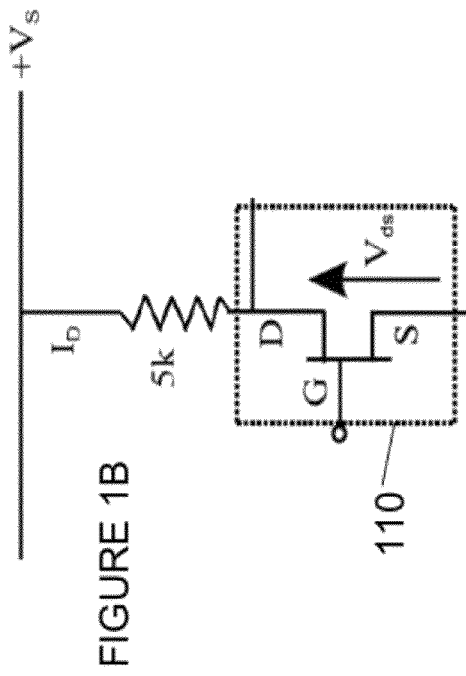
FIG. 1B illustrates a frequency multiplier component of one or more embodiments.
Figure 1A:
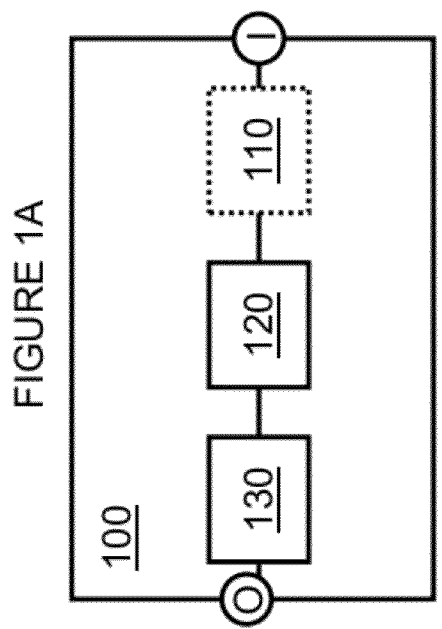
FIG. 1A illustrates an apparatus according to one or more embodiments of the present disclosure.
Figure 1C:
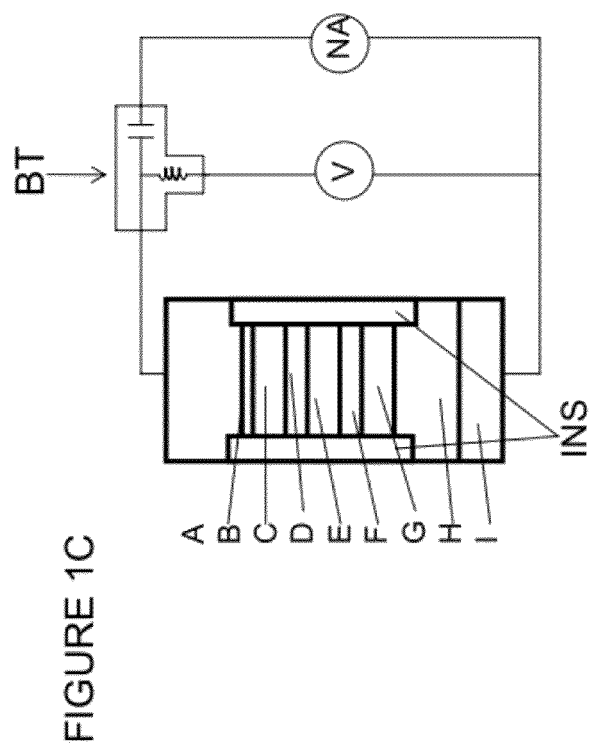
FIG. 1C illustrates a spin-torque oscillator (STO) and spectrum analyzer of one or more embodiments.

FIG. 1A illustrates an apparatus 100 according to a first embodiment. The apparatus 100 comprises a nano-scale spectrum sensor (or sensor) 120, a processing block 130 and an input/output interface (I/O). The sensor 120 is, in the illustration of the embodiment of FIG. 1A, a single nano-scale spectrum sensor capable of being excited by electromagnetic signaling. In this embodiment, the sensor is a magnetic tunnel junction (MTJ) although other types of nano-scale spectrum sensors, or more specific variations of magnetic tunnel junctions are within the scope of the present disclosure (such as spin torque oscillators (STO) which are based on magnetic tunnel junctions). A magnetic tunnel junction typically consists of two layers of magnetic metal, such as cobalt-iron, separated by an extremely thin insulating layer (such as aluminum oxide) with a thickness of about one nanometer (nm). FIG. 1C illustrates the typical structure of a magnetic tunnel junction and other such nano-scale spectrum sensors in combination with a circuit layout for detecting output from such sensors.

In FIG. 1C, the magnetic tunnel junction functions as a source radio frequency (RF) signal. The energy for the operation of the magnetic tunnel junction comes from a power source (V) through the coil part of the bias-T (BT). The bias-T (BT) has the function of separating the direct current (DC) and alternating current (AC) parts of the circuit such that a network analyzer (NA) only sees the radio frequency signal generated by the magnetic tunnel junction. The elements illustrated in FIG. 1C are provided below.

| Reference Designator | Element |
| --- | --- |
| A | Top Electrode |
| B | Cap |
| C | CoFeB (3) |
| D | MgO (0.85) |
| E | CoFeB (3) |
| F | Ru (0.85) |
| G | CoFe (2.5) |
| H | PtMn (15) |
| I | Bottom Electrode |
| INS | Insulator |

The insulating layer of the magnetic tunnel junction is typically made to be so thin that electrons can tunnel through the barrier if a sufficient bias voltage is applied between the two metal electrodes. In magnetic tunnel junctions, the tunneling current caused by the tunneling electrons depends on the relative orientation of magnetizations of the two ferromagnetic layers, which can be changed by an applied magnetic field. This phenomenon is called tunneling magnetoresistance (TMR) and is well understood by those skilled in the art. magnetic tunnel junctions can, in crude terms, be considered to be a type of diode that allow current to flow from one side to the other only in a particular direction.

Based on this principle, electrical/electromagnetic signaling applied to the magnetic tunnel junction will apply a bias voltage between the two metal electrodes. If the electrical signaling is oscillatory in nature (for example, electromagnetic signaling representative of received electromagnetic radiation) then this will have an affect on the relative orientation of magnetizations of the ferromagnetic layers in the magnetic tunnel junction. Different frequencies will mean different rates of change in the magnetization of the respective ferromagnetic layers in the magnetic tunnel junction, and as a result, the tunneling current will vary according to the frequency of the electromagnetic signaling applied to the magnetic tunnel junction.

As magnetic tunnel junctions can be functionally quite simple, they can also be made and/or combined to form the basis for other nano-scale sensors such as spin torque oscillators (discussed in more detail below). Such magnetic tunnel junctions or magnetic tunnel junction-based sensors can be seen to exhibit resonant characteristics upon signaling of a particular frequency being passed through them. The exact nature of the resonance and point that they occur depends (at least in part) on the materials the sensors are formed from and on the geometry of the sensor. In effect, the amount of current they let through is directly related to their tuning and the frequency of the applied magnetization (for example, due to electromagnetic signaling).

Therefore, by carefully selecting the materials that the magnetic tunnel junction is formed from, and appropriately dimensioning the relative thicknesses of the respective layers, it is possible to physically form the sensor 120 so as to be tuned to a particular predetermined frequency. In addition, magnetic tunnel junctions and other nano-scale sensors can also be electrically and/or magnetically tuned to particular frequencies via an applied magnetic and/or electric field, or by using an applied current (for example, placing the sensor in a constant magnetic field or the like). Formation and tuning of such magnetic tunnel junctions would be understood by the skilled person.

As discussed above, the sensor 120 (by nature of its physical attributes) is resonant at/tuned to a particular predetermined frequency. The sensor 120 will therefore be excited by and particularly sensitive to radiation received at and/or substantially near its particular predetermined tuned frequency, but will be less excited in response to frequencies that are not substantially at and/or near its predetermined tuned frequency.

As discussed above, the frequency of the incoming radiation will affect the tunneling current outputted by the sensor 120. The tunneling current output by the sensor 120 can then act as excitation signaling for onward provision to the processing block 130. The overall generated excitation signaling as produced by the array will, therefore, be inherently characteristic of which electromagnetic radiation frequency is being received by the array, and also of the magnitude of respective detected frequencies across the ambient spectrum.

The processing block 130 in this example is a dedicated processor/processing circuit (such as an application specific integrated circuit (ASIC)) configured to use the excitation of the sensor 120 to determine ambient electromagnetic radiation spectrum usage. The design and construction of such circuits is well understood in the art and will not be discussed further. This processing block 130 can therefore use the excitation signaling generated by the sensor 120 to determine the spectrum usage, in essence using the magnitude and/or form of the output tunneling current from the sensor 120 to establish what frequencies of radiation have been received.

In one embodiment, the processing block 130 comprises an amplifier to amplify excitation signaling generated by the sensor/sensors. In other embodiments the processing block 130 incorporates an analog to digital converter (ADC) that allows for sampling of the analog excitation signaling from the sensors so as to turn the signaling into digital information. Other components can be included with the processing block to provide different ways of analyzing the excitation signaling from the sensor/sensors to allow for monitoring of sensor excitation signaling. This in turn allows for checking of ambient spectrum usage.

In one particular embodiment, the processing block 130 comprises a threshold detector that is responsive to excitation signaling at a particular frequency exceeding a certain threshold (for example, voltage level). For a given sensor, the output excitation signaling has a magnitude that corresponds to the power of electromagnetic radiation in that location at the particular predetermined frequency of that sensor. Therefore, the threshold detector can identify when the magnitude of the output excitation signaling exceeds a certain predetermined threshold of the threshold detector, which in turn can provide some qualitative as well as quantitative information about the ambient electromagnetic spectrum usage.

For example, if the threshold detector is configured to have a predetermined threshold that is exceeded when the ambient electromagnetic spectrum usage at a particular frequency goes above a background radiation baseline, it is possible to identify that the particular frequency is in use in that area. In another example, the threshold detector is configured to have a predetermined threshold that is a particular operational threshold, above which a given type of device can be said to be operating (such as a wireless WiFi router, etc.). Such detectors can allow for simple ways of monitoring the usage of a certain frequency in the ambient spectrum.

The input/output interface (I/O) is a connection bus that allows for electrical connection of other devices or systems or the like to the apparatus 100. This can allow the apparatus 100 to be connected to existing systems/devices to provide the described functionality. In this example, the apparatus is installed in an unlicensed white-space device that needs to identify ambient/local spectrum usage to thereby establish channels open/available for use. Such white-space and other related devices are typically provided with a wide-band/broad-spectrum antenna configured to be able to receive ambient electromagnetic radiation. The apparatus 100 in this embodiment is electrically connectable (via the input/output interface) to such an antenna to allow for provision of received electromagnetic radiation as signaling to the apparatus 100 (and onwards for operation by the sensor 120 and processing block 130). In other embodiments the apparatus 100 is also be connectable to other types of antenna for receiving radiation, or to other devices that can provide signaling representative of electromagnetic radiation received in one or more locations.

In essence, the functionality of this apparatus allows for low-power monitoring of selective frequency usage in the ambient electromagnetic spectrum. For example, white-space devices operate as secondary users of unlicensed radio frequency channels, and as such need to determine what the spectrum usage is like in their immediate vicinity so as to identify which frequencies/frequency bands are free for use and those which are being used. Once this information has been determined via the functionality provided by the apparatus 100, the white-space device can select radio channels/frequencies that are suitable for use (for example, free for use in the vicinity of the apparatus).

The sensor 120 is formed so as to be tuned to a particular predetermined frequency of interest. One side of the sensor 120 is electrically connected to the processing block 130. The input of the sensor 120 is electrically connected to the input of the input/output interface (I/O), and the output of the processing block is electrically connected to the output of the input/output interface 130. All these components of the apparatus are integrated in a housing to provide this as an integrated module. In this example, the apparatus/module 100 is implemented in a portable electronic unlicensed white-space device to allow for determination of local/ambient spectrum usage. In other embodiments, the apparatus/module 100 can be electrically connected to other devices (portable or otherwise) or in tandem with existing systems.

Incoming radiation (for example, in the range of 7-8 gigahertz (GHz) with a peak at 7.2 GHz) is received by the apparatus 100 as electromagnetic signaling via the input (I). The received electromagnetic radiation/signaling excites the sensor 120 in a manner corresponding to the respective frequencies contained in the radiation and the tuned resonant frequency of the sensor. This excitation of the sensor 120 thereby causes tunneling current to be generated by the sensor 120, which produces excitation signaling electrically transmitted to the connected processing block 130. The processing block 130 receives the excitation signaling (with a strong output characteristic/indicative of a peak at 7.2 GHz in the ambient electromagnetic spectrum), and operates on the signaling to identify frequencies of radiation that have excited the sensor 120, and thereby determine spectrum usage in the vicinity of the apparatus 100.

For example, as discussed above the processing block 130 (in one embodiment) utilizes an amplifier configured to amplify excitation signaling generated by the sensor/sensors. Also, the processing block 130 can (in other embodiments already mentioned above) utilize an analog to digital converter (ADC) to sample the analog excitation signaling from the sensors into digital information. Other embodiments can also utilize a threshold detector (as discussed above). These components/arrangements can allow for monitoring of sensor excitation signaling, and in turn allow for checking of ambient spectrum usage. In addition, the autocorrelation function (this being a known function in the art) of the received excitation signaling can be computed, as any change in the autocorrelation function can serve as an indicator of the frequency of received radiation. It would be appreciated by a skilled person that there are a number of different ways that generated excitation signaling as received by the processing block could be analyzed to identify what frequency/frequencies of radiation elicited that particular excitation in the array (since electromagnetic induction is well understood in the art).

By providing these sensors, the sensor 120 is effectively monitoring frequency usage in a selective manner without using excessive amounts of power or actively monitoring spectrum usage all the time. Due at least in part to the materials available for forming magnetic tunnel junctions, often the magnetic tunnel junctions that are formed are tuned in the frequency range of 5 GHz upwards. This frequency is well above a number of typical electromagnetic radiation transmission operating wavelengths/frequencies that are used in standard applications (for example, WiFi at 2.4 GHz, radio transmissions, etc). Therefore, it can be helpful to be able to transform incoming electromagnetic radiation into a suitable frequency range for detection by a magnetic tunnel junction sensor.

Therefore, in a variation of the embodiment described above and shown in FIG. 1A, the apparatus 100 additionally comprises a frequency multiplier 110 (shown in dashed lines in FIG. 1A). The frequency multiplier 110 is a graphene ambipolar field effect transistor (FET) component and this is illustrated schematically in FIG. 1B. These components are relatively new, but their function is understood in the art. In essence, any electromagnetic radiation passing through the structure of the graphene frequency multiplier is altered so as to have the original frequency multiplied by an integral number (for example, 2, 3, 4, or higher). The exact integer by which the radiation frequency is multiplied is governed by the design/arrangement of a given graphene frequency multiplier (or set of multipliers).

The graphene multiplier 110 is advantageous for this variation, as the graphene multiplier can shift the frequency of radiation received by the apparatus (via the multiplier) into the frequency range of the sensor prior to detection/provision of the signaling to the sensor from the input without causing too many additional spectral sidebands. Such sidebands can be unwanted in many applications. This is due to the high spectral purity of the graphene frequency multipliers. Another advantage of using graphene frequency multipliers is that they can be used in higher frequencies than standard frequency multiplier components. In consequence, magnetic tunnel junctions that are resonant/sensitive in the 5-10 GHz range can be used to determine spectrum usage in much lower frequency ranges (such as 2-4 megahertz (MHz)) by using an appropriately configured graphene frequency multiplier to 'scale' or 'multiply' the received radiation up into the frequency range that the magnetic tunnel junctions are sensitive in. This allows for incoming electromagnetic radiation to be received at the graphene frequency multiplier 110 via the input (I), shifted into the frequency range of interest for the sensor 120, and passed on to the sensor 120. In some embodiments an array of frequency multipliers can be used and can be made operate on a single frequency. The signal from each of the multipliers can then be combined to enhance sensitivity of the apparatus.

By using frequency multipliers in this way, it is also possible to improve the accuracy and resolution of the apparatus. For example, if incoming electromagnetic radiation in the frequency range of 2-3 GHz is received, it can be scaled up by a factor of 4 to 8-12 GHz to effectively provide a larger 'spectrum portion' to analyze (i.e., a 4 GHz band to examine frequencies between 8 and 12 GHz rather than a smaller 1 GHz band to examine frequencies between 2 and 3 GHz). This can help to provides for an increase in frequency resolution of the apparatus. While only one frequency multiplier 110 is used is shown in this embodiment, other embodiments can utilize two, three, four or even more frequency multipliers. These can be concatenated together (with signal amplifiers) to multiply the signal by very large factors (for example, factors greater than just 2-10 can be achieved).

When in operation, incoming radiation (for example, in the range of 2-3 GHz with a peak at 2.4 GHz as per the WiFi operating frequency) is received by the graphene multiplier 110 as electromagnetic signaling via the input (I). The electromagnetic signaling representative of the radiation is then shifted into a different frequency range by the multiplier (in the manner described above, for example, multiplied by 3 so as to be shifted into the range of 6-9 GHz) so as to operable on by the sensor 120 (made to operate in the range 5-10 GHz with a peak at 7.5 GHz).

The shifted electromagnetic radiation/signaling excites the sensor 120 in a manner corresponding to the respective frequencies contained in the radiation signaling and the tuned resonant frequency of the sensor (i.e., 2.4 GHz is shifted to be 7.2 GHz which is very near to the predetermined frequency of the sensor). This excitation of the sensor 120 thereby causes tunneling current to be generated by the sensor 120, which produces excitation signaling electrically transmitted to the connected processing block 130. The use of frequency multipliers 110 allows for magnetic tunnel junctions at a high tuned frequency to be usable for detection of electromagnetic radiation at a much lower frequency.

In other embodiments, a different type of nano-scale sensor can be used. For example, a spin torque oscillator (spin torque oscillator, or spin-transfer torque oscillator which has already been mentioned briefly above) is another type of nano-scale sensor that can be made to operate in the same frequency/wavelength ranges as the magnetic tunnel junctions discussed above (given that spin torque oscillators operate on the same principles of operation as the basic magnetic tunnel junction design discussed above, i.e., variations in observed tunneling current due to magneto-resistance). Operation of a spin torque oscillator is based on the interaction of a spin-polarized current with a magnetic film. This interaction results in two effects: magneto-resistance; and spin-transfer torque.

In a spin torque oscillator sensor, the magneto-resistance is dependent on the electrical resistance and the relative orientation of the magnetization and the spin of the incident electrons (as discussed above, this is therefore linked to the frequency of the incoming radiation represented by electromagnetic signaling received by the sensor). Spin-transfer torque is the torque exerted by the spin-polarized electrons on the magnetic film. In the spin torque oscillator, the spin-transfer torque is used to drive an oscillation of the magnetization direction of the magnetic film (again, sensitive in the GHz frequency range). This oscillation in turn is transformed into an oscillating electrical signal by the magneto-resistance effect to provide output excitation signaling to the processing block. Other nano-scale sensors are also within the scope of this disclosure.

Figure 7:
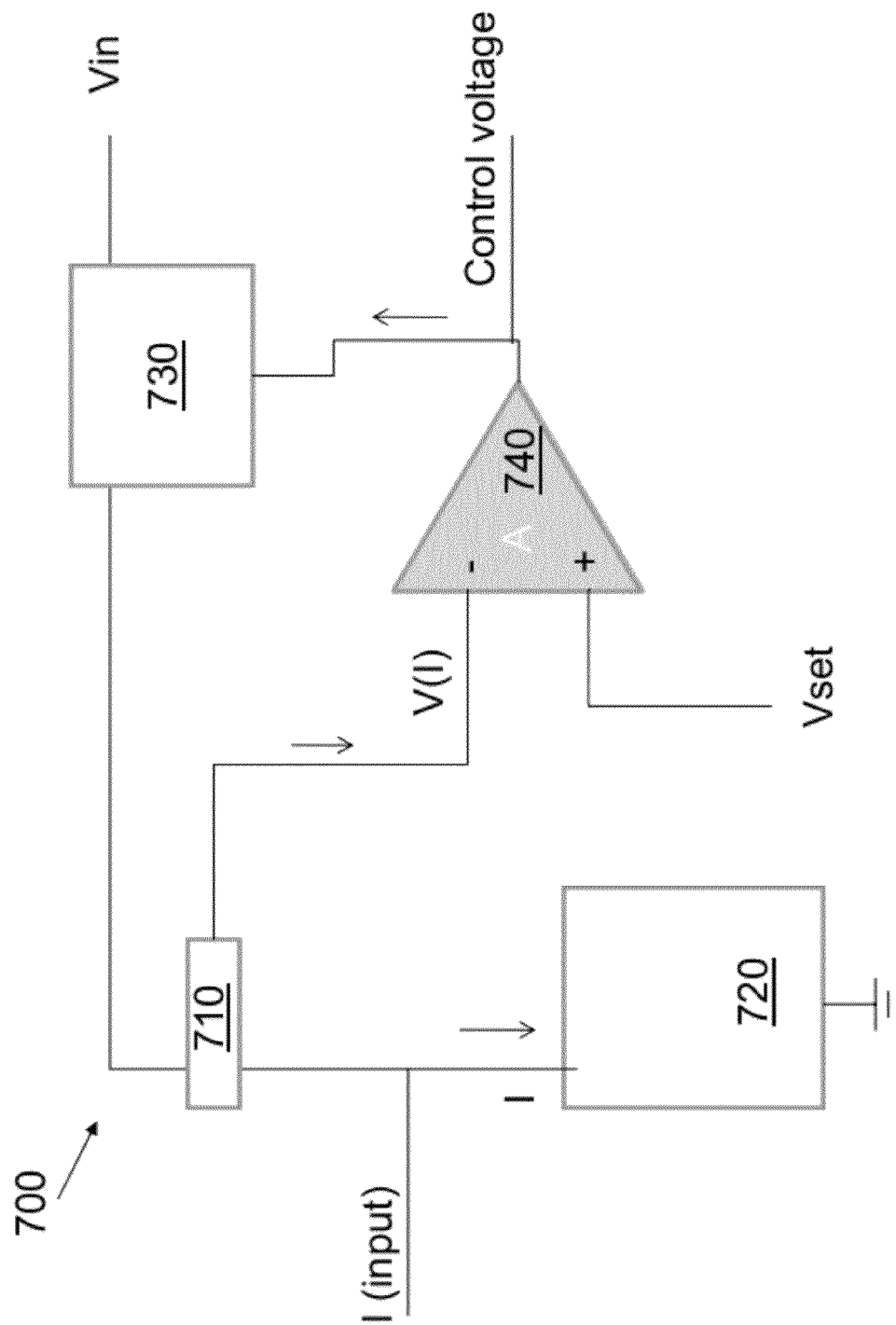
FIG. 7 illustrates a feedback loop for a spin-torque oscillator according to the present disclosure.

FIG. 7 illustrates a feedback loop setup for a spin torque oscillator. This feedback loop 700 comprises a component 710 for measuring the DC current going into the spin torque oscillator (STO) 720 (so as to be able to convert the current value to a corresponding voltage), a voltage error amplifier 740, a voltage reference (Vset) and a current driver 730. The current drawn to the spin torque oscillator 720 will change in response to external excitation from incoming signaling (from input), and so the error amplifier 740 tries to correct/compensate for the change of current by adjusting the voltage to spin torque oscillator (relative to the initial voltage reference corresponding to Vset). By observing and monitoring this compensatory behavior, it is possible to identify the frequencies of ambient electromagnetic radiation causing this response in the spin torque oscillator 720. This is summarized by the following steps wherein electromagnetic radiation (received as signaling at input) causes change in spin torque oscillator dynamics, current goes down (in one situation), corresponding voltage goes down, and the error amplifier 740 detects this and lowers the applied voltage using the amplifier 730 and the control voltage goes down accordingly. In effect, the incoming electromagnetic radiation provided to the spin torque oscillator 720 as signaling will elicit some change in the dynamic behavior of the spin torque oscillator 720 from its initial state, and the response of the spin torque oscillator 720 will be characteristic of the frequencies of radiation eliciting that change.

In this embodiment, the input signal is applied via the input (I) and applied to the spin torque oscillator together with an applied voltage that gives the spin torque oscillator the ability to oscillate (as per the nature of spin torque oscillators discussed above). The current provided to the spin torque oscillator 720 consists of a DC component and AC component, wherein the AC component corresponds to the electromagnetic signaling applied to the input. The DC component of the current is measured by measurement means 710, and as a result a voltage signal corresponding to the DC component of the spin torque oscillator current is applied to the inverting input (−) of the error amplifier 740. Further, this signal is compared to set point Vset (which sets a resting current Idc for the spin torque oscillator 720) that is applied to the non-inverting terminal (+) of the error amplifier 740.

If the signal from measurement means 710 increases (corresponding to an increase in spin torque oscillator current), the control voltage defined by the voltage difference between the + and − inputs of the error amplifier 740 and a predetermined error amplifier gain (a set characteristic of the error amplifier) will, in turn, decrease. This also results in a lowering of the voltage on the spin torque oscillator side of the voltage amplifier 730. This effectively restores the current at the spin torque oscillator 720 to a predetermined 'equilibrium' value. If the current change was due to the AC component of the input current, the control voltage at the output of amplifier 740 offers a measure of the AC component at the input. This happens because the spin torque oscillator 720 changes its DC resistance due to the external AC excitation at and/or near its natural resonant frequency.

In essence, when electromagnetic radiation is received and applied as an input signal to the spin torque oscillator 720, the applied signal changes the dynamics of the oscillatory signal of the spin torque oscillator 720. This can be observed via a feedback signal from the spin torque oscillator 720 (see FIG. 1C, for example). The applied signal changes the dynamics of the oscillator and this is observed as a narrowing of the oscillation spectrum of the spin torque oscillator 720. The resulting narrowing means that the associated autocorrelation function also narrows. The processing block of such an embodiment utilizing a spin torque oscillator 720 instead of a basic magnetic tunnel junction can analyze the output signaling from the spin torque oscillator 720 to identify ambient spectrum usage. Other possible ways of monitoring the output/feedback from the spin torque oscillator to determine ambient spectrum usage will be appreciated by the skilled person.

In another variation of the embodiment of FIG. 1A (this variation is not shown in the FIGUREs), the sensor is actually formed from a plurality of sensors that are arranged to form an array. This embodiment operates in substantially the same way as the embodiment of FIG. 1A, except that the array sensors are formed to operate on different predetermined frequencies. These are each formed to be tuned to a particular predetermined frequency (tuning of magnetic tunnel junctions is understood by the skilled person and has been discussed above).

For example, an array in such an embodiment could have five sensors. The first sensor can be tuned to $f_{lower}$ which defines the lower limit of the tuned range of the array, and the last/fifth sensor can be tuned to $f_{upper}$ which defines the upper limit of the tuned range of the array. The intermediate sensors (second, third and fourth) can be tuned to provide equal frequency increments between the sensors. This can allow the array to be electromagnetically excitable evenly over the range.

By providing an array of sensors, a wide range of frequencies can be covered by the apparatus (typically wider than a single sensor) whilst still retaining a small form factor due to the nano-scale size of these sensors. When signaling is generated by excitation of the array due to received radiation, the processing block of the apparatus can then determine what frequencies are being used. This passive selective frequency monitoring means that power consumption is greatly reduced for monitoring spectrum usage in comparison with the prior art, and also ease of manufacture and complexity of operation is also reduced. As has been discussed above, when used in white-space devices, this allows for low-power monitoring of ambient spectrum usage so as to allow the white-space device to identify suitable channels for use.

This functionality can also be applied in other situations. For example, wide-band transceivers often wish to broadcast on as many channels as possible without interfering with existing spectrum usage. The present apparatus can allow for monitoring of spectrum usage to identify/determine such channels. Alternatively, a wide-band (or broad-spectrum) transceiver can be receiving a vast number of signals on different radio channels across a spectrum and it needs to tune into a particular channel (for example, the strongest signal). This apparatus allows such transceiver to locate and be directed towards specific frequency channels by monitoring of the ambient spectrum. Other advantages are also within the scope of this embodiment and other embodiments discussed in the present disclosure.

Figure 2:
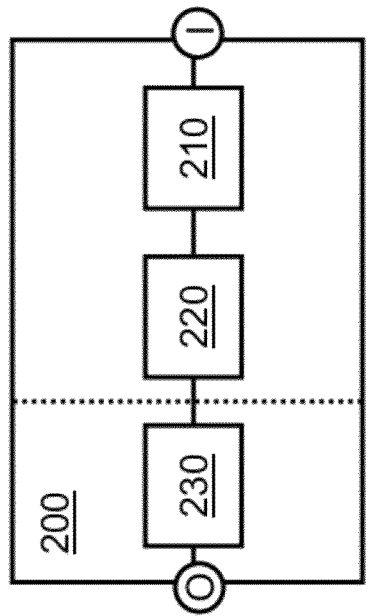
FIG. 2 illustrates another embodiment of the present disclosure.

Another embodiment is shown in FIG. 2. In this embodiment, the operation is the same as apparatus 100 of FIG. 1A, and is composed of the same components. However, in this example, the processing block is distinct and separate from the other components. This can allow for a processor to be provided separately from the sensor and frequency multiplier, or for a sensor (or an array with frequency multiplier) as described above to be connected to a general purpose processor to provide the functionality of the embodiment of FIG. 1A. This processor therefore operates by detecting electromagnetic excitation of a nano-scale spectrum sensor configured to be electromagnetically excitable at a predetermined frequency based on received ambient electromagnetic radiation, and determining ambient electromagnetic radiation spectrum usage using the detected excitation of the nano-scale spectrum sensor.

Figure 3:
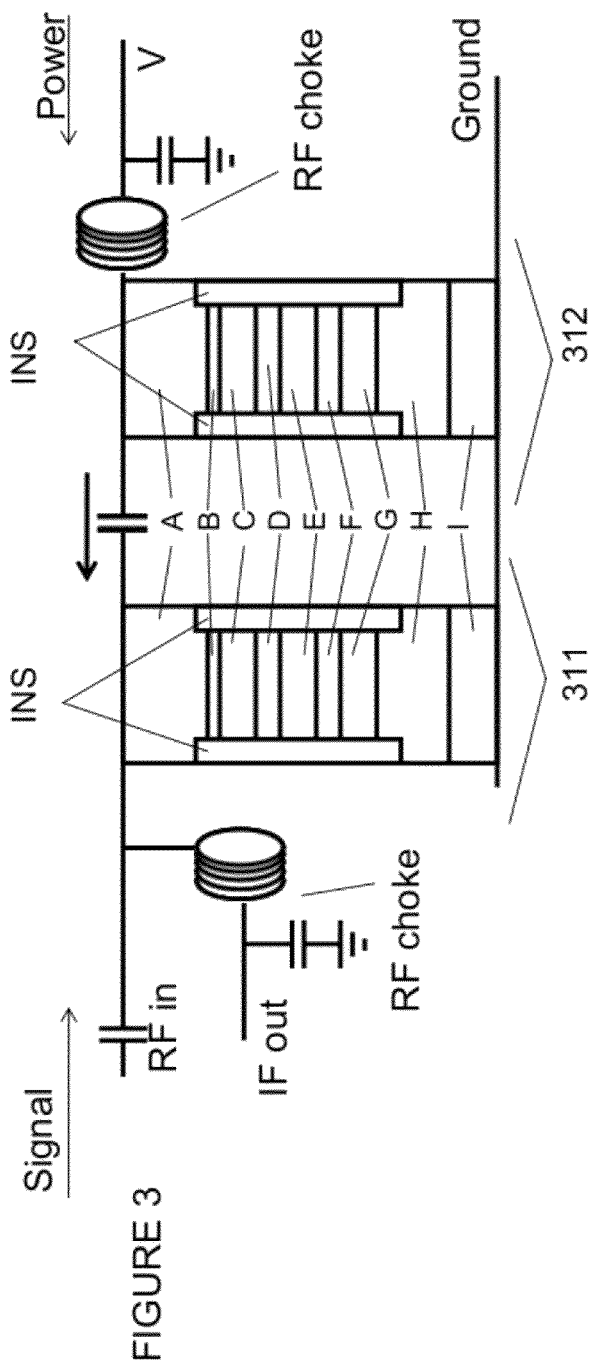
FIG. 3 illustrates an example schematic of a sensor pair for detecting ambient electromagnetic radiation.
Figure 5:
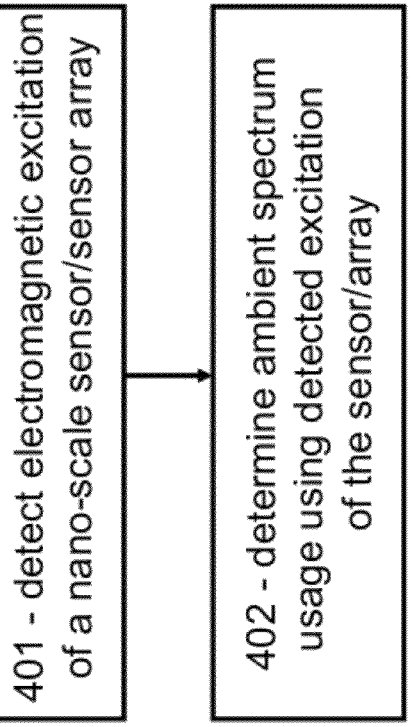
FIG. 5 illustrates a method of operation of an apparatus of the present disclosure.

FIG. 5 illustrates the steps that such a processor would undertake to perform the above described functionality, which will now be described with reference to FIG. 3. FIG. 3 illustrates a specific type of sensor that can be utilized in another embodiment of apparatus 100/200. In this embodiment, the nano-scale sensor 120 of the first embodiment shown in FIG. 1A is a sensor pair formed from a first magnetic junction sensor 311, and a second spin torque oscillator sensor 312 connected in series with the first sensor 311. In essence, this is a "local oscillator+mixer" combination that creates a particular sensor pair arrangement, specifically a heterodyne/homodyne type arrangement, that allows for wide frequency range detection. The elements of the sensor pair are akin to the sensor of FIG. 1C.

This combination of a magnetic tunnel junction and a spin torque oscillator create a frequency selective detector sensor pair. This detector/sensor pair is able to detect frequencies that are substantially at or near the spin torque oscillator oscillation frequency (i.e., the tuned/predetermined frequency of the sensor pair as a complete sensor/detector arrangement). The spin torque oscillator acts as a reference sensor providing a reference oscillation frequency that interacts with the incoming radiation, and the magnetic tunnel junction acts as a mixer between the oscillatory output of the spin torque oscillator and the incoming radiation. This acts as a heterodyne or homodyne detector that can detect different frequencies of electromagnetic radiation. In essence, the output of the sensor pair is directly related to the frequency of the incoming radiation. The operation of typical oscillator and mixer heterodyne/homodyne arrangements are well understood in the art, so this will not be discussed in detail.

With regard to the operation of the sensor pair, upon receiving radiation across the spectrum, the sensor pair generates excitation signaling in response to the received radiation. By virtue of the heterodyne/homodyne (i.e., mixer-type) arrangement of the sensor pair, the excitation signaling generated by the sensor pair has characteristics determined both by the frequency of received radiation (frequencies across at least a portion of the spectrum) and also the tuned predetermined frequency of the reference sensor (i.e., the oscillation reference frequency of the spin torque oscillator). In particular, this arrangement of the two sensors 311, 312 generates signaling that is the product of the received radiation frequency and the tuned frequency of the reference sensor (although other arrangements can generate excitation signaling that is governed in other ways by the sensor pair arrangement and the incoming/received radiation).

As the tuned frequency of the spin torque oscillator sensor is known (the oscillatory frequency of the spin torque oscillator), it is possible to determine ambient electromagnetic spectrum usage from the generated excitation signaling and the known reference sensor frequency. In crude terms, by 'dividing' the output excitation signaling of the sensor pair by the reference spin torque oscillator sensor oscillation frequency it is possible to establish electromagnetic radiation usage across at least a portion of the electromagnetic spectrum. This helps to reduce the need for a separate sensor for distinct/discrete radiation frequencies and provides a more versatile sensor for monitoring spectrum usage. In summary, by providing for this sensor pair it is possible to passively monitor a large/wide portion of the electromagnetic spectrum with just one sensor pair, rather than a whole array of sensors tuned to individual frequencies. In other embodiments, multiple sensor pairs can be provided for a more robust and flexible system for monitoring spectrum usage.

Figure 4:
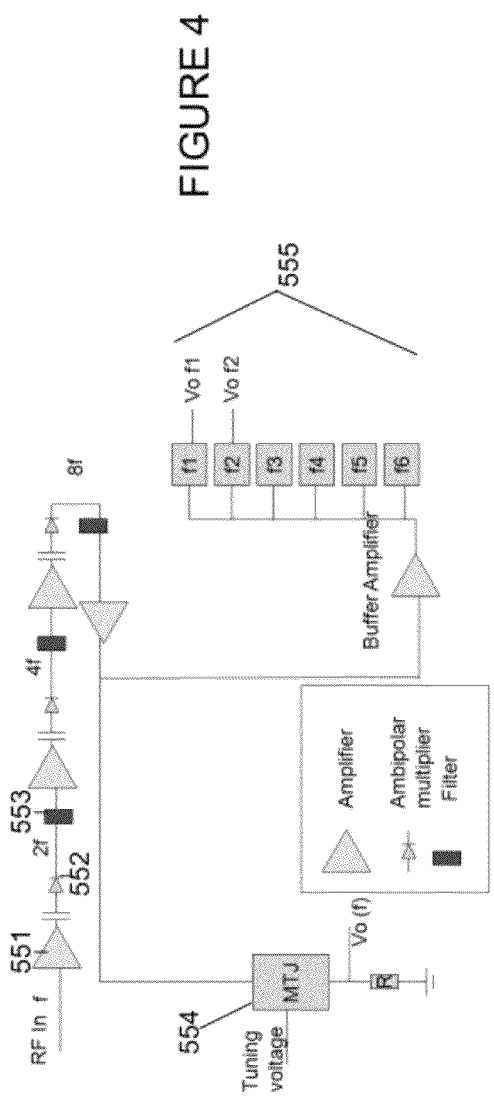
FIG. 4 illustrates a further embodiment of the present disclosure.

FIG. 4 illustrates another example combining elements of embodiments discussed above. This embodiment utilizes a number of frequency multipliers 552 together with an array of sensors to allow for wide frequency range detection and spectrum usage determination. At the 'RF in' side of this embodiment is a multiplier chain that starts with an amplifier 551. The amplified electromagnetic signaling (at frequency 'f') received at the start of the multiplier chain is then provided to the graphene multiplier 552 and onwards to a filter 553. The filter allows for certain frequencies to be passed onwards beyond the multiplier chain (for example, frequencies that are double/triple/quadruple, etc the lowest and highest frequencies in the signaling received at 'RF in'). The signaling is now at frequency '2f' in this example, and is then passed to another multiplier stage comprising another amplifier, multiplier and filter. This serves as a further concatenated multiplier stage to produce signaling that has been multiplied again (for example, by another factor of 2 to get a frequency output of '4f', and another stage can again multiply the frequency to '8f'). More stages or fewer stages can be used as desired to multiply received signaling into a particular frequency range.

As a result of the received signaling passing through such a multiplier chain, the originally received signaling (for example, in the range of 1-2 GHz) now spans a frequency range that is some multiple of that original frequency range (for example, the new range of 8-16 GHz). The nature of the graphene frequency multipliers help to reduce and can even eliminate the problems associated with sidebands introduced by currently known frequency shifting methods.

The signaling multiplied by the multiplier chain can then be analyzed by a magnetic tunnel junction 554 (in the form of a rectifier, for example, bearing in mind the diode analogy above) that is tuned to be sensitive to a particular/wanted frequency by an external tuning voltage. Alternatively, the signal can be applied to an array of magnetic tunnel junctions 555 that are on predetermined frequencies such that, for example, magnetic tunnel junction f1 is sensitive between 8-9 GHz, f2 between 9-10 GHz and so on.

Also, this embodiment utilizes a number of filters. By adding specific band-pass filters as shown in FIG. 4, the sensitivity of the apparatus can be modified so as to be sensitive only to frequencies very close to the sensor oscillation frequency. This embodiment utilizes a wideband/broad-spectrum antenna that receives a spectrum of interest. Once the wideband receiver has received radiation of interest, it can be passed electrically (after amplification) to the sensors which then effectively act like electromagnetic resonators (as opposed to antennae) to generate excitation signaling as per the embodiments described above.

FIG. 5 illustrates a method of operation of one or more of the above described embodiments. The method comprises detecting electromagnetic excitation of a nano-scale spectrum sensor configured to be electromagnetically excitable at a predetermined frequency based on received ambient electromagnetic radiation in a step of module 401. The method also comprises determining ambient electromagnetic radiation spectrum usage by using the detected excitation of the nano-scale spectrum sensor in a step or module 402. This method and variations thereof have been described above at length and therefore will not be discussed further.

Figure 6:
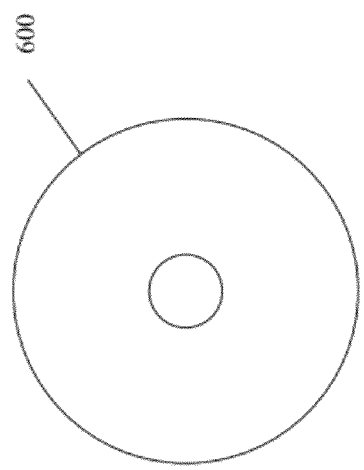
FIG. 6 illustrates schematically a computer readable media providing a program according to an embodiment of the present disclosure.

FIG. 6 illustrates schematically a computer/processor readable media 600 providing a program according to an embodiment of the present invention. In this example, the computer/processor readable media is a disc such as a digital versatile disc (DVD) or a compact disc (CD). In other embodiments, the computer readable media can be any media that has been programmed in such a way as to carry out an inventive function. In some embodiments, there is provided an apparatus having a processor and a computer readable media/memory including computer program code stored thereon. The processor and computer program code are together configured to, with the processor, cause the apparatus to perform the method as described above.

One or more of the above embodiments help provide advantages for cognitive radio technology, where up-to-date information regarding spectrum usage is needed to effectively communicate across electromagnetic communication channels. By determining spectrum usage in the manner described, low power monitoring of ambient spectrum usage can be achieved. Devices that require active up-to-date knowledge of spectrum usage in their immediate vicinity can utilize one or more the above embodiments to monitor spectrum usage but with reduced drain on power/energy reserves/supplies and reduced computational complexity over the prior art.

It will be appreciated to the skilled reader that any mentioned apparatus/device and/or other features of particular mentioned apparatus/device be provided by apparatus arranged such that they become configured to carry out the desired operations only when enabled, for example, switched on, or the like. In such cases, they may not necessarily have the appropriate software loaded into the active memory in the non-enabled (for example, switched off state) and only load the appropriate software in the enabled (for example, on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (for example, memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signaling" may refer to one or more signals transmitted as a series of transmitted and/or received signals. The series of signals may comprise one, two, three, four or even more individual signal components or distinct signals to make up the signaling. Some or all of these individual signals may be transmitted/received simultaneously, in sequence, and/or such that they temporally overlap one another. With reference to any discussion of any mentioned computer and/or processor and memory (for example, including read only memory (ROM), CD-ROM, etc), these may comprise a computer processor, application specific integrated circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An apparatus comprising a nano-scale spectrum sensor configured to be electromagnetically excitable at a predetermined frequency based on received ambient electromagnetic radiation, the apparatus being configured to be able to use excitation of said nano-scale spectrum sensor to determine ambient electromagnetic radiation spectrum usage.

2. The apparatus as recited in claim 1 wherein said nano-scale spectrum sensor comprises one or more magnetic tunnel junctions and/or one or more spin torque oscillators.

3. The apparatus as recited in claim 1 further comprising a graphene frequency multiplier configured to multiply a frequency of one or more portions of received ambient electromagnetic radiation, prior to detection by said nano-scale spectrum sensor, so as to shift a frequency range of said one or more portions of received ambient electromagnetic radiation into a particular predetermined frequency of said nano-scale spectrum sensor.

4. The apparatus as recited in claim 1 wherein said nano-scale spectrum sensor is configured to be able to generate excitation signaling in response to being excited by received electromagnetic radiation at and/or near a particular predetermined frequency, and said apparatus is configured to determine, based on said generated excitation signaling, ambient electromagnetic radiation spectrum usage.

5. The apparatus as recited in claim 4 wherein said apparatus is configured to use an auto-correlation function on excitation signaling to determine spectrum usage.

6. The apparatus as recited in claim 1 wherein said nano-scale spectrum sensor comprises a sensor pair formed from:
a first sensor, and
a second sensor coupled to said first sensor, wherein said first sensor is tuned to a first predetermined excitation frequency, said second sensor is tuned to a second predetermined excitation frequency, and one of said first and second sensors of said sensor pair is configured to act as a reference sensor, the sensor pair being configured to generate excitation signaling in response to being excited by ambient electromagnetic radiation, said excitation signaling being generated based on a frequency of received radiation and a predetermined excitation frequency of said reference sensor, the apparatus being configured to determine a frequency of received radiation based on a generated excitation signaling to thereby determine ambient electromagnetic radiation spectrum usage.

7. The apparatus as recited in claim 1 wherein said nano-scale spectrum sensor comprises a sensor pair formed from:

a first sensor, and a second sensor coupled to said first sensor so as to define a heterodyne/homodyne sensor pair, wherein said first sensor is configured to act as a mixer, and said second sensor is configured to act as a local oscillator to provide a reference frequency for said sensor pair, said sensor pair being configured to be able to generate excitation signaling in response to being excited by ambient electromagnetic radiation, said excitation signaling being generated based on a frequency of received radiation and a reference frequency of said second sensor, the apparatus being configured to determine a frequency of received radiation based on a generated excitation signaling to thereby determine ambient electromagnetic radiation spectrum usage.

8. The apparatus as recited in claim 6 wherein said sensor pair is configured to generate excitation signaling that is a product of frequency of received radiation and said tuned frequency of said reference sensor, the apparatus being configured to determine said ambient electromagnetic radiation spectrum usage from said generated excitation signaling based on said predetermined excitation frequency of said reference sensor.

9. The apparatus as recited in claim 1 further comprising a filter configured to filter said generated excitation signaling of said sensor pair to allow for determination of frequencies substantially at said predetermined excitation frequency of said reference sensor.

10. The apparatus as recited in claim 1 further comprising a processor configured to detect electromagnetic excitation of said nano-scale spectrum sensor, and determine ambient electromagnetic radiation spectrum usage using a detected excitation of said nano-scale spectrum sensor.

11. The apparatus as recited in claim 1 further comprising a wide-band antenna configured to receive one or more portions of ambient electromagnetic radiation in said electromagnetic spectrum for provision to at least one nano-scale spectrum sensor.

12. The apparatus as recited in claim 1 further comprising an array of nano-scale spectrum sensors configured to be electromagnetically excitable at different predetermined frequencies based on received ambient electromagnetic radiation, wherein said apparatus is configured to use an excitation of said sensor array to determine ambient electromagnetic radiation spectrum usage.

13. The apparatus o as recited in claim 1 wherein the apparatus is selected from the group consisting of:

a white-space device, a portable electronic device, and a module for a white-space/portable electronic device.

14. An apparatus comprising:

at least one processor; and at least one memory including computer program code, said at least one memory and said computer program code configured to, with the at least one processor, cause said apparatus to perform:

detection of electromagnetic excitation of a nano-scale spectrum sensor configured to be electromagnetically excitable at a predetermined frequency based on received ambient electromagnetic radiation, and determination of ambient electromagnetic radiation spectrum usage using a detected excitation of said nano-scale spectrum sensor.

15. A portable electronic device comprising the apparatus of claim 14.

16. A method, comprising:

detecting electromagnetic excitation of a nano-scale spectrum sensor configured to be electromagnetically excitable at a predetermined frequency based on received ambient electromagnetic radiation; and determining ambient electromagnetic radiation spectrum usage using a detected excitation of said nano-scale spectrum sensor.

* * * * *